United States Patent [19]

Sorensen

[11] Patent Number: 4,853,749

[45] Date of Patent: Aug. 1, 1989

[54] AREA EXPOSURE MACHINE

[75] Inventor: Kai Sørensen, Lyngby, Denmark

[73] Assignee: Eskofot A/S, Ballerup, Denmark

[21] Appl. No.: 172,573

[22] Filed: Mar. 24, 1988

[30] Foreign Application Priority Data

Mar. 25, 1987 [DK] Denmark .............................. 1523/87

[51] Int. Cl.⁴ ........................................... G03B 27/72
[52] U.S. Cl. ....................................... 355/71; 362/347
[58] Field of Search ................... 355/8, 43, 66, 71, 67; 362/217, 220, 222–225, 297, 307, 347

[56] References Cited

U.S. PATENT DOCUMENTS

| 3,125,301 | 3/1964 | Stotter | 362/217 |
| 3,592,544 | 7/1971 | Brendel | 355/67 X |
| 4,295,186 | 10/1981 | Sugiura et al. | 355/67 X |
| 4,728,993 | 3/1988 | Hilgers | 355/71 X |

FOREIGN PATENT DOCUMENTS 144304  2/1982  Denmark .
2851828  6/1979  Fed. Rep. of Germany .

OTHER PUBLICATIONS

"Principles of Reflecting Reflectors", Ed. K. Balslev, 1 LPNyt 471, Pub. by Louis Poulsen & Co. A/S , Jan. 28, 1983; pp. 4147–4154.

Primary Examiner—Richard A. Wintercorn
Attorney, Agent, or Firm—Cushman, Darby & Cushman

[57] ABSTRACT

An area exposure machine for reproduction equipment and comprising an oblong light source (1) and a reflector behind the light source. The reflector is shaped substantially as an involute curve. As a result a uniform exposure of a relatively large area can be achieved, and the distance between the light source (1) and the area to be exposed can be reduced. As reflections towards the light source are avoided the consumption of energy can also be reduced. The reflector is advantageously composed of planar surfaces approximating an involute curve, and each planar surface is advantageously wedge-shaped whereby a more uniform exposure is obtained. The area exposure machine can for instance be used in connection with a contact printing box.

4 Claims, 3 Drawing Sheets

AREA EXPOSURE MACHINE

FIELD OF THE INVENTION

The invention relates to an area exposure machine for reproduction equipment and comprising an oblong light source and a reflector behind the light source.

BACKGROUND ART

DE-OS No. 2,434,885 discloses an area exposure machine providing a substantially uniform exposure. This area exposure machine compriese two elongated light sources with reflectors on each side of the surface to be exposed. This known machine requires a comparatively large amount of space.

SUMMARY OF THE INVENTION

The object of the invention is to provide an area exposure machine taking up less space than known machines, and the area exposure machine according to the invention is characterised by comprising only one light source with a reflector shaped substantially as an involute curve. As a result it is possible to expose a relatively large area with a uniform intensity and to reduce the distance between the light source and the area to be exposed.

For production reasons the reflector may be composed of planar surfaces approximating involute curves, and each planar surface may be substantially wedge-shaped, whereby a more uniform exposure is obtained.

BRIEF DESCRIPTION OF THE DRAWINGS

The invention is described in greater details below with reference to the accompanying drawings, in which.

DESCRIPTION OF THE PREFERRED EMBODIMENT

Figure 1:
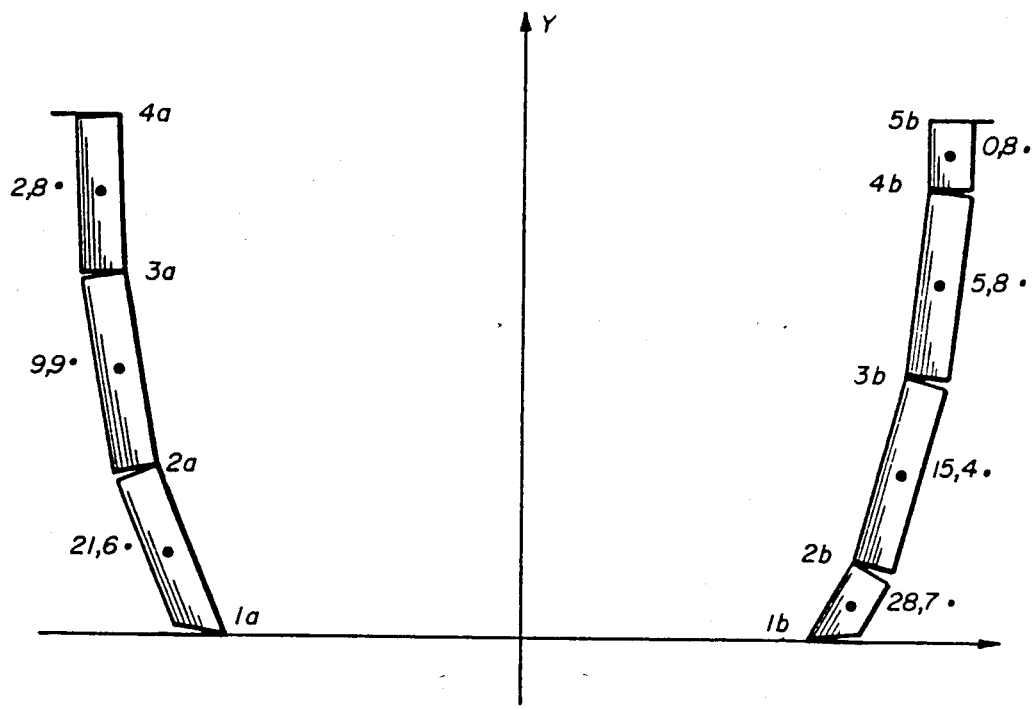
FIG. 1 is a sectional view of a reflector according to the invention.
Figure 2:
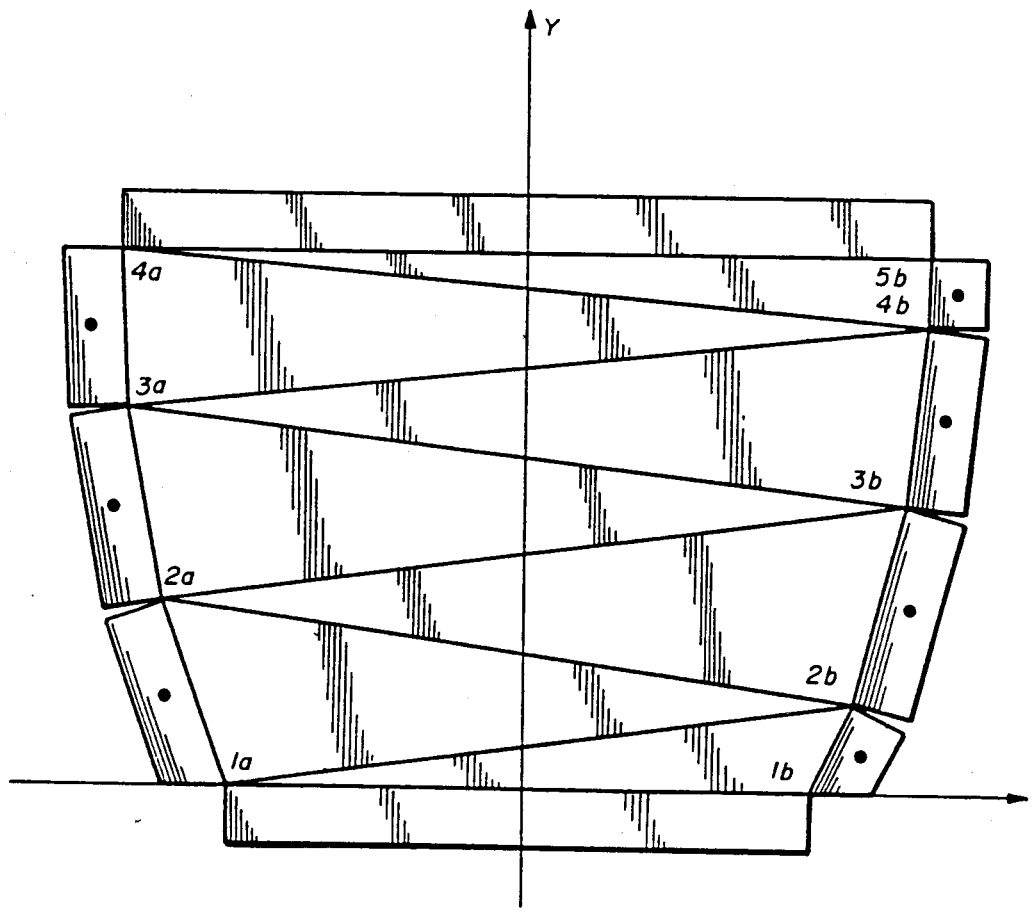
FIG. 2 is a side view of the reflector.

The reflector of FIG. 1 forms part of an area exposure machine for reproduction equipment. The area exposure machine furthermore comprises an elongated light source 1. The reflector must be shaped in such a manner that it reflects all the light emitted by the light source, i.e. also the light usually emitted beside the glass plate of the box. In particular the reflector must cover the space below the light source and preferably at a relatively low depth so as to utilize the height of the box in the best possible manner and preferably so as to avoid reflections towards the light source. This requires that a portion of the reflector is preferably separated from the rest of the reflector and constitutes a relatively compact auxiliary reflector. The auxiliary reflector is provided with a ventilating duct and is placed in a cup allowing suction of cooling air. Several auxiliary reflectors have been manufactured. All these auxiliary reflectors are in principle elongated reflectors only controlling the light in the plane perpendicular to the axis of the light source. Furthermore they are supplemented with vertical mirrors opposite the ends of the light source, said ends being the side surfaces of the suction cup. The elongated reflector appears as a sectional curve in the plane perpendicular to the light source as well as through the faceting introduced relative thereto.

A solution is to use a uniformly extending curve of a relatively dense faceting. In this manner the light is directed past the light source and substantially towards the glass plate, said glass plate thereby being subjected to some exposure. Another solution is to use a small number of planar facets, whereby reflections towards the light source can still be avoided and part of the light flux is reflected by the main reflector and exposes the glass plate through further reflections.

In principle the first-mentioned solution is the best solution, but this solution involves a rather complicated reflector which is difficult to manufacture. Therefore the last-mentioned solution constitutes the basis of the reflector described below. This solution corresponds in other words to a "new light source" including the light source plus its reflections in the auxiliary reflector. This new light source requires the main reflector to be operating correctly relative thereto.

The same aspect applies as far as it goes for the distance between the end mirrors too, i.e. the width of the suction cup. Simplified one can say that a small distance implies that the main reflector reflects a "small light source" which causes an effective distribution of the light in the vertical plane through the axis of the light source. A large distance causes, on the other hand, a less effective distribution.

Different distances between the auxiliary mirrors have been tested. The auxiliary reflector described below has a relatively large distance due to the fact that said auxiliary reflector is composed of a few large surfaces which would not otherwise provide a sufficient exposure in the middle of the glass plate. The main reflector must supplement the basic exposure provided by the auxiliary reflector in such a manner that the total exposure is as uniform as possible.

As the basic exposure of the auxiliary reflector decreases towards the edges of the glass plate, said exposure must be supplemented in the fringe areas.

As a result the main reflector must expose the fringe area of the glass plate over a predetermined width and by a predetermined intensity compensating for the exposure of the auxiliary reflector of the central portion of the glass plate.

Apart from a single attempt of adjusting a dynamically balanced main reflector which clearly turned out to be unfit, tests have only been carried out with main reflectors originally formed as square or rectangular shafts, the sides of which are parallel to the edges of the glass plate.

These shafts have all been facetted embodiments of an original of such a cross section that the light reflected from the light source forms strongly exposed bands about the edges of the glass plate.

The division of the cross section of the original form into lines concerning the faceting has subsequently been chosen in such a manner that the exposure only achieves the necessary level at the edges and besides is decreasingly extended towards the centre of the glass plate. The bending angles between the facets were identical so as to simplify the production. The latter implies, however, that the facets take up almost the same angular space with respect to height as seen from the light source, and consequently they have an effect on exactly the same portions of the glass plate. As a result the exposure is not uniform.

A better function is achieved when the lowermost facet fills out the largest angular interval seen from the light source, and when said interval is uniformly reduced upwards along the shaft. The latter corresponds to the fact that the points of discontinuity between the facets differ, i.e. most at the bottom of the shaft and the least at the top thereof. The latter implies that all the facets have a reflection of the light source when seen from the edge of the glass plate, whereafter the reflections disappear one by one when you move your eye towards the centre of the glass plate.

The above effect is obtained from both main members relative to the reflector. However, the effect is most significant in the main plane perpendicular to the axis of the light source where the largest possibility of controlling the light exists. This main plane has therefore been longitudinally applied onto the glass plate.

Besides it is noted that all the bending lines are inclined in such a manner that the facets form triangles. As a result a reflection does not disappear suddenly from one point to another. Furthermore the bendings about the bending lines operate as "parabols" relative to the entire length of the light source. These factors are important because fast variations and edges in the exposure may otherwise occur. The effect of small bending points is found to be absolutely necessary in connection with the present light source.

The four sides of the shaft are preferably identical in such a manner that the shaft is substantially square.

Although the original shapes are identical, the mechanical faceting requires that two identical sides and two mirror images thereof are manufactured.

A plurality of main reflectors have been manufactured which are distinguished by their number of facets and the mutual bending angles thereof. The object is to achieve the correct grading of the exposure at the fringe areas of the glass plate.

Besides the co-operation of the auxiliary reflector and the main reflector has presented a problem because the auxiliary reflector exposes said main reflector. When you move your eye from the edge of the glass towards the centre thereof, the following should be observed. At the rim all the facets have a mirror image whereafter said images disappear one by one from the top. However, subsequently they must again be provided with a mirror image of the mirror image of the light source at the top in one of the surfaces of the auxiliary reflector etc. In this manner the main reflector exposes the entire glass plate through several series of reflections of the light source.

The above procedure is also interrupted by bendings and other inaccuracies. In particular directions including too few mirror images may exist whereby the exposure is locally too low. The latter corresponds to the reflector substantially reflecting a space between the light source and the mirror image thereof.

The above feature can be avoided by choosing the second solution for the auxiliary reflector, where an exposure from the auxiliary reflector beneath the main reflector is avoided. The latter solution would, however, only move the problem because the auxiliary reflector would then be more concentrated and subjected to corresponding requirements as to accuracy.

The objects of the invention is to achieve the best possible solution by means of the above characteristics, viz. a simple auxiliary reflector, and relatively large dimensions of the main reflector, and the inclined bending lines. Furthermore improvements involve diffusion of the light, which in turn causes a reduction of the level.

FIG. 1 illustrates a bent plate for a shaft side in the main reflector. Two such plates are necessary as well as two plates appearing at the illustrated reflection about the Y-axis. The latter plates can be manufactured by punching or the like procedure where all the X-coordinates change their signs, or possibly by using the same co-ordinates provided the sheet material is turned.

The plate is provided with ears bent backwards and serving to join the four members. The bending between two facets must approximately be of the angle corresponding to the difference between the angle of inclination of the facets. As a result the bendings have the angles 7.1°, 6.2°, 5.5°, 4.1°, 3.0°, and 2.0°, calculated from the bottom and upwards.

The plates may optionally be bent in an edge bending machine having an inclined end stop for each bending line and including bending angles as stated above. The problem involved in two of the plates being laterally reversed can optionally be solved by the plates being turned and by the signs on the bending angles simultaneously being changed. In this manner the same end stops should be applicable for all the plates.

Figure 3:
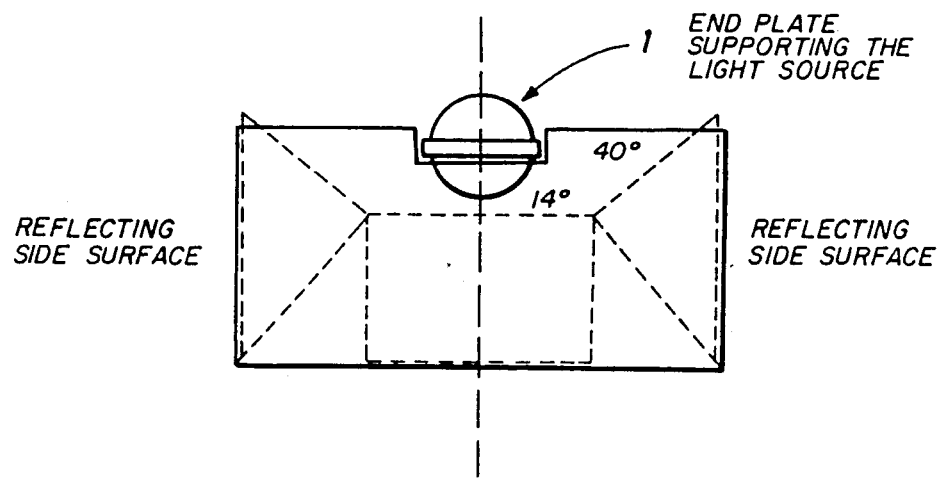
FIG. 3 is a sectional view of an auxiliary reflector.

FIG. 3 illustrates how the bent auxiliary reflector is situated in the suction cup also bent, and how the light source is situated relative thereto. It appears that the three webs at the top and the bottom of the auxiliary reflector must be bent 90° downwards to establish the placing of the auxiliary reflector in the suction cup. The position is correct when the two outermost plates of the auxiliary reflector have been bent 40° upwards, cf. FIG. 3. The optical devices are situated on a metal bar comprising mountings for the light source. The light source is situated in such a manner relative to the auxiliary reflector that the bulb is spaced approximately 3 mm from the webs bent upwards. Subsequently, the auxiliary reflector is adjusted with respect to height in such a manner that all the facets show a mirror image of the light source as seen from the edge of the glass plate being spaced 50 cm from the centre. The latter applies when the optical devices are situated with the axis of the light source being perpendicular to the longitudinal direction of the glass plate in the middle below the centre of said glass plate and at a depth so that the lower rim of the suction cup is approximately 88 cm below the glass plate.

The area exposure machine according to the invention is particularly suited for contact printing boxes where a relatively uniform exposure of a planar surface is desired, at the same time as the distance between the surface and the light source must be minimized. The good utilization of the light source implies furthermore that a lower effect than previously, such as 200 W, suffizes. Furthermore the problems involved in an instantaneous start are solved as the lamp can operate on half effect all the time without involving consumption and release of a particularly high effect. The lamp may for instance be of the type Philips HPA400.

The involute curves have for instance been mentioned in the article "Principles of Reflecting Reflectors" in LP-NYT 471. The invention is inter alia based on the fact that this principle has been further developed in such a manner that it can be used in connection with reproduction equipment, such as in connection with a contact printing box of the type Eskofot 280 DL.

I claim:

1. An area exposure machine for reproduction equipment, comprising;

an oblong light source; and a reflector, said reflector comprising at least four reflector members, each being shaped substantially as a respective involute curve.

2. An area exposure machine as in claim 1, wherein the members are symmetrically placed in pairs.

3. An area exposure machine as in claim 1, wherein:

each said reflector member comprises a plurality of planar surfaces which, together, approximate a respective involute curve, said planar surfaces each being substantially wedge-shaped in frontal elevation.

4. An area exposure machine for reproduction equipment, comprising:

an oblong light source; and a reflector, said reflector comprising at least four reflector members, each being shaped substantially as a respective involute curve;

said light source being coupled in series with a coil.

* * * * *